(12) United States Patent
Takagi et al.

(10) Patent No.: US 9,165,748 B2
(45) Date of Patent: Oct. 20, 2015

(54) PLASMA CVD METHOD

(75) Inventors: Tomoko Takagi, Yokohama (JP);
Masashi Ueda, Yokohama (JP)

(73) Assignee: IHI CORPORATION, Tokyo (JP)

( * ) Notice: Subject to any disclaimer, the term of this patent is extended or adjusted under 35 U.S.C. 154(b) by 642 days.

(21) Appl. No.: 12/855,809

(22) Filed: Aug. 13, 2010

(65) Prior Publication Data

US 2010/0316815 A1    Dec. 16, 2010

Related U.S. Application Data

(60) Division of application No. 12/368,740, filed on Feb. 10, 2009, which is a continuation of application No. 10/276,371, filed as application No. PCT/JP01/04113 on May 17, 2001, now abandoned.

(30) Foreign Application Priority Data

May 17, 2000   (JP) .................................. 2000-145645
Aug. 7, 2000   (JP) .................................. 2000-239221

(51) Int. Cl.
*H01J 37/32*        (2006.01)
*C23C 16/509*       (2006.01)
*H01L 21/306*       (2006.01)

(52) U.S. Cl.
CPC ............. *H01J 37/321* (2013.01); *C23C 16/509* (2013.01)

(58) Field of Classification Search
CPC   H01J 37/321; H01J 37/3211; H01J 37/32119
USPC ................ 438/758, 788; 427/569; 118/723 I, 118/723 IR, 723 AN; 156/345.48, 345.49; 315/111.51
See application file for complete search history.

(56) References Cited

U.S. PATENT DOCUMENTS 5,324,360 A    6/1994  Kozuka
5,525,159 A    6/1996  Hama et al.
(Continued)

FOREIGN PATENT DOCUMENTS

DE    41 36 297 A1    5/1993
DE    195 03 205 C1   7/1996
(Continued)

OTHER PUBLICATIONS

Kroll et al., Fast Deposition of a-Si:H Layers and solar Cells in a Large-Area (40×40cm$^2$) VHF-GD Reactor, Materials Research Society Symposium Proceedings vol. 557, 1999, pp. 120-126, Material Research Society, Warrendale, PA.
(Continued)

*Primary Examiner* — Luz Alejandro Mulero
(74) *Attorney, Agent, or Firm* — Buchanan Ingersoll & Rooney PC

(57) ABSTRACT

A plasma CVD method uses an electrode array in a reaction chamber, the electrode array including a plurality of inductively coupled electrodes, each electrode being folded back at the center so that each electrode is substantially U-shaped with two parallel straight portions, the electrodes are arranged such that all of the parallel straight portions are arranged parallel to each other in a common plane, each of the electrodes having at least a portion with a diameter of 10 mm or less, and a phase controlled power supply for feeding high frequency power to the feeding portions so as to establish a standing wave of a half wavelength or natural number multiple of a half wavelength between a feeding portion and a folded back portion and between a grounded portion and the folded back portion, and is controlled to have a phase difference between adjacent two feeding portions.

4 Claims, 8 Drawing Sheets

(56) References Cited

U.S. PATENT DOCUMENTS

| | | | |
|---|---|---|---|
| 5,560,776 A * | 10/1996 | Sugai et al. | 118/723 AN |
| 5,571,366 A | 11/1996 | Ishii et al. | |
| 5,681,418 A * | 10/1997 | Ishimaru | 156/345.37 |
| 5,795,452 A | 8/1998 | Kinoshita et al. | |
| 5,824,158 A | 10/1998 | Takeuchi et al. | |
| 5,891,349 A | 4/1999 | Tobe et al. | |
| 5,965,034 A | 10/1999 | Vinogradov et al. | |
| 6,030,667 A | 2/2000 | Nakagawa et al. | |
| 6,068,784 A | 5/2000 | Collins et al. | |
| 6,181,069 B1 | 1/2001 | Tonotani et al. | |
| 6,221,155 B1 | 4/2001 | Keck et al. | |
| 6,503,816 B2 | 1/2003 | Ito et al. | |
| 6,719,876 B1 | 4/2004 | Ueda et al. | |
| 2004/0053479 A1 | 3/2004 | Ito | |

FOREIGN PATENT DOCUMENTS

| | | |
|---|---|---|
| EP | 0 908 921 A1 | 4/1999 |
| JP | 3-13578 | 1/1991 |
| JP | 3-122274 | 5/1991 |
| JP | 04-021781 | 1/1992 |
| JP | 04-236781 | 8/1992 |
| JP | 07-094421 | 4/1995 |
| JP | 9-106952 | 4/1997 |
| JP | 09-268370 | 10/1997 |
| JP | 10-060654 | 3/1998 |
| JP | 10-265212 | 10/1998 |
| JP | 63-276222 | 11/1998 |
| JP | 11-131244 | 5/1999 |
| JP | 11-243062 | 9/1999 |
| JP | 11-260593 | 9/1999 |
| JP | 11-317299 | * 11/1999 |
| JP | 2000-12471 | 1/2000 |
| JP | 2000-345351 | 12/2000 |
| JP | 2001-035697 | 2/2001 |
| WO | WO 99/19898 A2 | 4/1999 |

OTHER PUBLICATIONS

Ryuichi Miyano et al., "New Plasma Source of Coaxially Symmetric Surface Wave in VHF Band", Journal of Research Institute for Science and Technology, vol. 8, (1996), pp. 65-69.

Yaoxi Wu et al., "The Influence of Antenna Configuration and standing Wave Effects on Density Profile in a Large-Area Inductive Plasma Source", Plasma Source Science Technology 9 (2000), pp. 210-218.

E. Räuchle, "Duo-Plasmaline, a Surface Wave Substained Linearly Extended Discharge" Journal of Physics IV France 8 (1998), Pr 7-99-Pr7-108.

Z. Zakrzewski et al., "Linear Field Applicators", Journal of Physics IV France 8 (1998), Pr7-109-Pr7-118.

* cited by examiner

PLASMA CVD METHOD

This application is divisional of application Ser. No. 12/368,740, filed Feb. 10, 2009, which is a continuation of application Ser. No. 10/276,371, filed Nov. 15, 2002, which is a national stage application of International Application No. PCT/JP2001/04113, filed May 17, 2001, which claims the priority of JP 2000-145645 and JP 2000-239221, the contents of which are incorporated herein by reference.

TECHNICAL FIELD

The present invention relates to a plasma CVD apparatus and method and, more particularly, to the plasma CVD apparatus and method for depositing thin films having excellent film thickness uniformity by using inductively coupled electrodes.

BACKGROUND OF INVENTION

Solar cells have been noted and expected as a clean energy source, but their cost reduction is indispensable for their spread. It has, therefore, been earnestly desired to provide an apparatus to deposit high quality a-Si film with uniform thickness distribution over large-area substrate at a high throughput.

To deposit thin films such as a-Si film, a parallel-plate (or capacitively coupled type plasma CVD apparatus has been widely used. In this case, the film can be formed on only the surface of one substrate facing the electrode plate. For this reason, to simultaneously deposit films on two substrates in a deposition chamber, the film can be formed at most on both substrates by arranging two electrodes in the chamber forming two discharge regions. There is also an idea of multi-zone deposition system where the number of discharge regions is further increased. However, it is practically very difficult to realize this system because the system has disadvantages due to its complex structure and low maintainability.

In addition, large area solar cells having a desired characteristic can be hardly manufactured since the film thickness uniformity is seriously lowered with the increase in the size of the substrates.

A variety of investigations have been made to observe plasma with uniform density over large area substrates in order to deposit thin films with uniform thickness distribution. However, it is very difficult for the parallel-plate type electrode system to generate uniform plasma over a large area substrate as the electrode becomes large with the substrate. This is attributed to the essential difficulties of the parallel-plate type electrode system, as will be mentioned below.

First, this system requires a precise arrangement of two electrode plates with a prescribed distance all over the electrodes to generate plasma with uniform density, which is practically difficult as the substrate becomes large.

In addition, as the electrodes are enlarged, standing waves tend to appear on the electrode surfaces, which causes non-uniformity of plasma density. This non-uniform plasma distribution becomes more noticeable when higher frequencies such as in the VHF band is employed. For these reasons, the upper limit of the substrate size has been thought to be, for example, 0.3 m×0.3 m when the high frequency of 80 MHz is employed (U. Kroll et al. and Mat. Res. Soc. Symp. Proc. Vol, 557 (1999), p121-126).

Under such a circumstance, other type of plasma CVD method using inductively coupled type electrodes has been proposed. This method is absolutely different in the mechanism for maintaining the discharge from the capacitively coupled type plasma CVD method. This method does not require precise arrangement of electrodes, and high-density plasma can be obtained using the excitation frequency in the VHF band which is advantageous for depositing high quality a-Si film at high deposition rate. The plasma CVD apparatus using inductively coupled type electrodes are exemplified in Japanese Patent Laid-Open 4-236781 that employs a ladder-shaped electrode and in Japanese Patent No. 2785442 that employs a zigzagged-folded electrode.

During the investigations on a variety of inductively coupled electrodes including the above-mentioned electrodes, the present inventors have found that as the inductively coupled electrodes such as the ladder-shaped or zigzag-folded electrodes become larger, the current flowing on the electrodes tends to vary with the positions and standing waves appear at unexpected positions. In short, it was found difficult to create uniform plasma to cope with the large area substrates so far as the electrode structures of the prior art are employed.

Accordingly, the present inventors carried out fundamental investigations on the plasma homogenization using the inductively coupled electrodes and developed several electrode structures that positively utilize the standing waves which caused the uniformity to deteriorate in the prior art inductively coupled electrodes. Here, for instance, a U-shaped electrode was used, which had a power feeding portion at one end and a grounded portion at the other end. The distance from the turning portion to the feeding portion and the grounded portion were set to be a half wavelength of the high-frequency wave to establish the standing wave at predetermined position over the electrode (Japanese Patent Application No. 11-255219). When plasma was generated to form thin film in this configuration, the film thickness distribution obtained was such that the film thickness decreased from the feeding portion toward the turning portion, then increased to show a maximum, decreased again. This distribution is thought to originate in the interaction of the attenuation of high frequency power and the effect of standing waves. Since this film thickness distribution is reproducible, the idea is to obtain thin films with uniform thickness distribution by using only the region with desired uniformity of film thickness of about the same size as the substrate.

Since this film forming method utilizes the portion of the electrode where the uniform plasma density is generated, the electrode becomes longer than the substrate, and thus the apparatus itself becomes larger. On the other hand, a smaller apparatus is strongly requested from the viewpoints of the floor space to be installed, the maintainability, and the cost. Accordingly, the electrode structure and apparatus that can generate the uniform plasma in longer region along the electrode are inevitable to comply with the requests.

In addition, in order to continuously perform stable thin film formation using a plasma CVD apparatus, it is necessary to periodically carry out cleaning etc. to remove films deposited, such as on the inner wall of chamber before the deposited films peel off. However, since the plasma density in the vicinity of the power feeding portion was very high in the case of the U-shaped electrode structure, a large amount of the film deposited on the wall near the power feeding portion. This necessitated more frequent cleaning treatments.

Under such circumstances, the present invention aims at providing a plasma CVD apparatus and method which can form high quality thin films having an excellent film thickness uniformity on larger substrates. That is, the objective of this invention is to provide the electrode structure and the power supply method which make it possible to expand the uniform plasma region in the longitudinal direction of the electrode, and thereby, to realize a plasma CVD apparatus and method which enable to form thin films having an excellent uniformity on a larger substrate using the same size apparatus as that of prior art. Another object of the invention is to provide a plasma CVD apparatus and method that make it possible to form such thin films at a high throughput. Still another object of the invention is to provide a high-productive plasma CVD apparatus and method by suppressing the film deposited, such as on the inner wall of apparatus, to extend cleaning cycle.

DISCLOSURE OF INVENTION

In the process of attaining the above-mentioned purpose, the present inventors have made various examination about the power supply method of high frequency power, electrode structures, film formation conditions and the like in order to expand the uniform plasma density region and found that the discharge region is expanded or shrinked, depending on the diameter of the U-shaped electrode, and that the plasma density near the power feeding portion is relatively changed. In addition, the experiments using an electrode whose diameter is partially varied showed that the plasma density has a tendency to vary along the electrode depending on the diameter. Moreover, when the U-shaped electrode was covered with a dielectric, a peculiar dependence of the film thickness distribution on the manner of covering was observed. The present invention has been accomplished by further examination on the plasma homogeneity and film thickness uniformity on the basis of such information.

That is, a plasma CVD apparatus of this invention comprises, in a reaction chamber, an inductively coupled electrode which is straight line or folded back at the center and has a feeding portion at the first end and a grounded portion at the second end, wherein the electrode has a diameter of 10 mm or less at least partially between the feeding portion and grounded portion, and whereby high frequency power is fed to the feeding portion so as to establish a standing wave of a half wavelength or natural number multiple of a half wavelength between the feeding portion and grounded portion or between the feeding and grounded portions and the turning portion.

Thus, by setting the excitation wavelength $\lambda$ of high frequency power and the distance L between the feeding portion and grounded portion or between the feeding (and grounded) portion and the turning portion so that the equation $L=n \cdot \lambda/2$ nearly holds (n: a natural number), the plasma can be stably generated and maintained, and, in addition, the plasma with uniform density can be formed over a prescribed region of electrode.

Furthermore, as the diameter of the electrode is further decreased in the range of less than 10 mm, the glow discharge region can be expanded in the direction along the electrode with less power, which makes it possible to deal with a larger substrate. In addition, since the plasma density near the feeding portion relatively becomes low, the amount of film deposited on the inner wall near the feeding portion will decrease. As a result, a cleaning cycle will be extended. Thus, there is especially no limit on electrode diameter so far as it is less than 10 mm; however, the diameter of 1 mm-10 mm is preferable from a viewpoint of handling and easy attachment. Moreover, the diameter can be changed along the electrode.

Strictly speaking, in the relation between excitation wavelength $\lambda$ and distance L, $\lambda$ is different from $\lambda 0$ in the vacuum that is determined by an excitation frequency f and the propagation velocity c in the vacuum. According to the inventors' examination, $\lambda$ is given by $\lambda 0$ to first approximation, but is changed by dielectric constants, the geometric configuration, and the like of the dielectric and the plasma surrounding the electrode, the geometric configuration, and the like.

Further, plasma CVD apparatus of this invention comprises, in a reaction chamber, an inductively coupled electrode which is straight line or folded back at the center and has a feeding portion at the first end and a grounded portion at the second end, wherein the diameter of the electrode is varied, and whereby high frequency power is fed to the feeding portion so as to establish a standing wave of a half wavelength or natural number multiple of a half wavelength between the feeding portion and the grounded portion or between the feeding and grounded portions and the turning portion.

When the diameter is varied within one electrode, the plasma intensity is inclined to vary depending thereon. Therefore, uniform plasma density can be attained by partially varying the diameter corresponding to the plasma density distribution produced when the electrode of the constant diameter is used. Further in this case, the glow discharge region is expanded and the plasma is made uniform by setting the electrode diameter to 10 mm or less, Therefore, it becomes possible to form thin films having an excellent thickness uniformity on larger substrates.

A plasma CVD apparatus of this invention comprises, in a reaction chamber, an inductively coupled electrode which is straight line or folded back at the center and has a feeding portion at the first end and a grounded portion at the second end, wherein the electrode surface is at least partially covered with a dielectric, and whereby high frequency power is fed to the feeding portion so as to establish a standing wave of a half wavelength or natural number multiple of a half wavelength between the feeding portion and the grounded portion or between the feeding and grounded portions and the turning portion.

By covering the electrode surface with a dielectric, the plasma density distribution can be homogenized in the longitudinal direction of the electrode. That is, the same effect is acquired as the case where the electrode diameter is varied, and it becomes possible to form thin films having a uniform thickness distribution on a larger substrate using the apparatus of the same dimension. That is, the apparatus can be made compact.

Moreover, it is preferable to vary the thickness of dielectric in the longitudinal direction of the electrode. For example, in order to suppress the non-uniformity due to the thick deposited film near the power feeding portion, the dielectrics is preferably made thick near the feeding portion, and made gradually thinner along the electrode. In order to suppress the thick deposited film near the electrode center, it is desirable to cover the center portion with a thick dielectric having tapered edges which the thickness is decreased toward the ends. Thereby, a steep impedance change at the edges of dielectric is avoided, which makes it possible to form more uniform plasma. Instead, the dielectric may be wound around the electrode to yield a helix. Thereby, the plasma density distribution is flattened at the dielectric edge, and thus is made more uniform along the electrode.

A plasma CVD apparatus of this invention comprises a plurality of the inductively coupled electrodes which are arranged in parallel in a common plane. By a simple configuration wherein a plurality of electrodes are arranged in the widthwise direction of a substrate, it becomes possible to form uniform thin films on the substrate having any width.

Here, it is preferable to feed the power to the electrodes so that the phases of power supplied to respective feeding portions should have a prescribed relation. This is because, if the phase of each electrode is not under control, the film thickness distribution tends to become non-uniform and irreproducible in the substrate widthwise direction. It is preferable to make the phase in anti-phase between adjacent electrodes. Thereby, the film thickness uniformity is further improved. That is, the film thickness uniformity is remarkably improved not only in the substrate widthwise direction but also in the longitudinal direction of the electrode by the interaction of the high frequency power between adjacent electrodes.

Furthermore, a plasma CVD apparatus of this invention is characterized in that the inductively coupled electrodes are arranged in a plurality of layers, and substrates are arranged on both sides of each layer. By using the inductively coupled electrodes, unlike the capacitively coupled electrode system, the so-called "multi-zone deposition system" can be adopted without inviting the enlargement of the apparatus or difficulties for maintenance. Thus, a film deposition apparatus, which forms thin films simultaneously on a number of substrates, can be constructed. As a result, the throughput can be drastically improved to reduce the cost of, for example, solar cells.

A plasma CVD apparatus of this invention is characterized in that a plurality of inductively coupled electrodes, each of which is straight line or folded back at the center and has a feeding portion at the first end and a grounded portion at the second end, are arranged in parallel to each other in a reaction chamber, wherein the phase of high frequency power is made in anti-phase between the feeding portions of adjacent electrodes, and whereby high frequency power is fed to the feeding portions so as to establish standing waves of a half wavelength or natural number multiple of a half wavelength between the feeding portions and the grounded portions or between the feeding and grounded portions and the turning portions.

The supply of anti-phase power is also effective when the electrode is not covered with a dielectric and can prevent the thick film region near the electrode center.

A plasma CVD method of this invention comprises, arranging, in a reaction chamber, an inductively coupled electrode which is straight line or folded back at the center and has a feeding portion at the first end and a grounded portion at the second end, the electrode having a diameter of 10 mm or less at least partially between the feeding portion and grounded portion, or having a varying diameter, and feeding a high frequency power to the feeding portion so as to establish a standing wave of a half wavelength or natural number multiple of a half wavelength between the feeding portion and the grounded portion or between the feeding and grounded portions and the turning portion to generate a plasma of reactive gas introduced in the reaction chamber to form a thin film including at least one element constituting the reactive gas.

Moreover, a plasma CVD method of this invention comprises, arranging, in a reaction chamber, an inductively coupled electrode which is straight line or folded back at the center and has a feeding portion at the first end and a grounded portion at the second end, the electrode being at least partially covered with a dielectric, and feeding high frequency power to the feeding portion so as to establish a standing wave of a half wavelength or natural number multiple of a half wavelength between the feeding portion and the grounded portion or between the feeding and grounded portions and the turning portion to generate a plasma of reactive gas introduced in the reaction chamber to form a thin film including at least one element constituting the reactive gas.

Furthermore, a plasma CVD method comprises arranging a plurality of inductively coupled electrodes, each of which is straight line or folded back at the center and has a feeding portion at the first end and a grounded portion at the second end, in parallel in a deposition chamber, and feeding a high frequency power to the feeding portions to establish a standing wave of a half wavelength or natural number multiple of a half wavelength between the feeding portions and the grounded portions or between the feeding and grounded portions and the turning portions to generate a plasma of reactive gas introduced in the reaction chamber to form a thin film including at least one element constituting the reactive gas, wherein the phase of the high-frequency power is made in anti-phase between the adjacent feeding portions of the electrodes.

BRIEF DESCRIPTION OF THE INVENTION

FIGS. 4a, 4b, and 4c show examples of the dielectric's shape covering the electrode.

Figure 5:
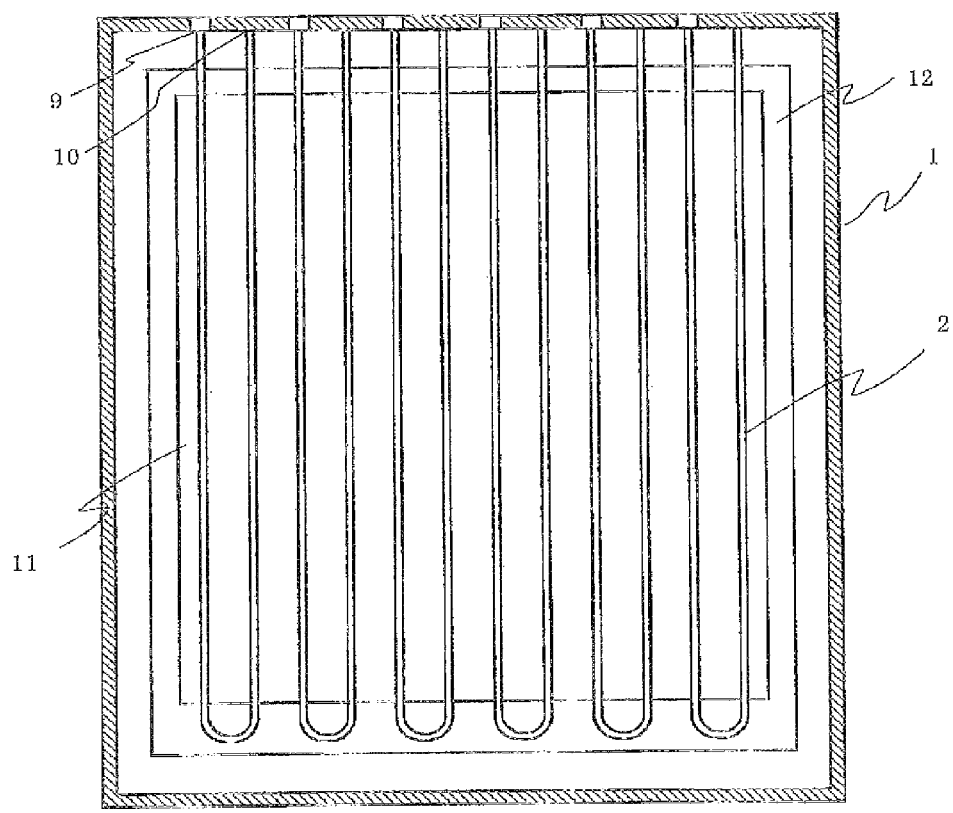
Figure 6:
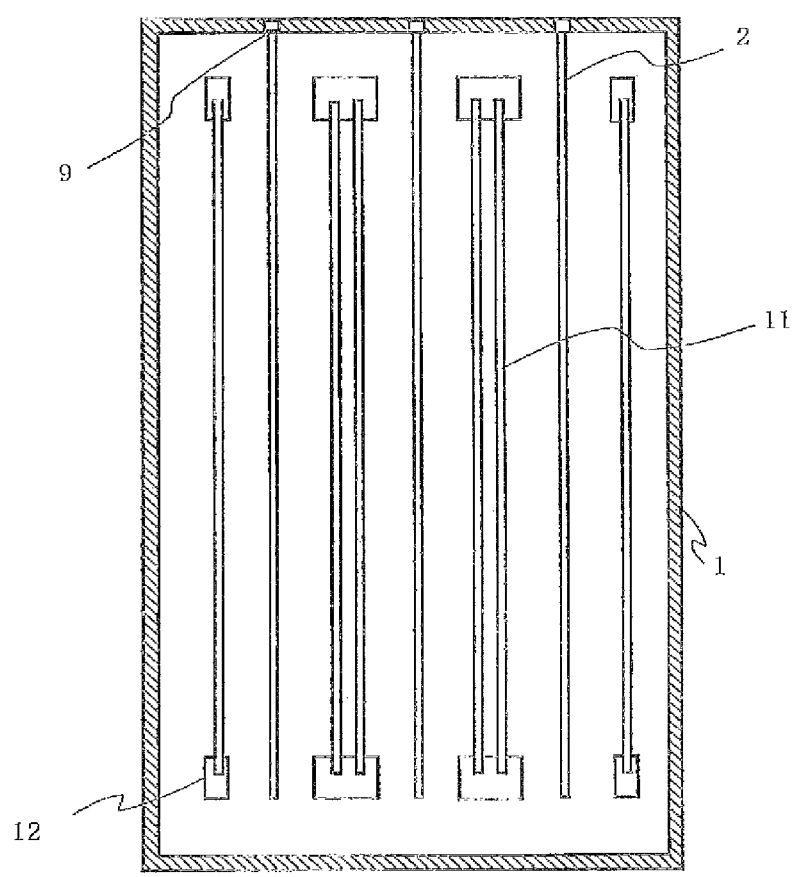

FIG. 5 is a schematic sectional view showing the third embodiment of a plasma CVD apparatus of this invention FIG. 6 a schematic sectional view showing the fourth embodiment of a plasma CVD apparatus of this invention.

Figure 7:
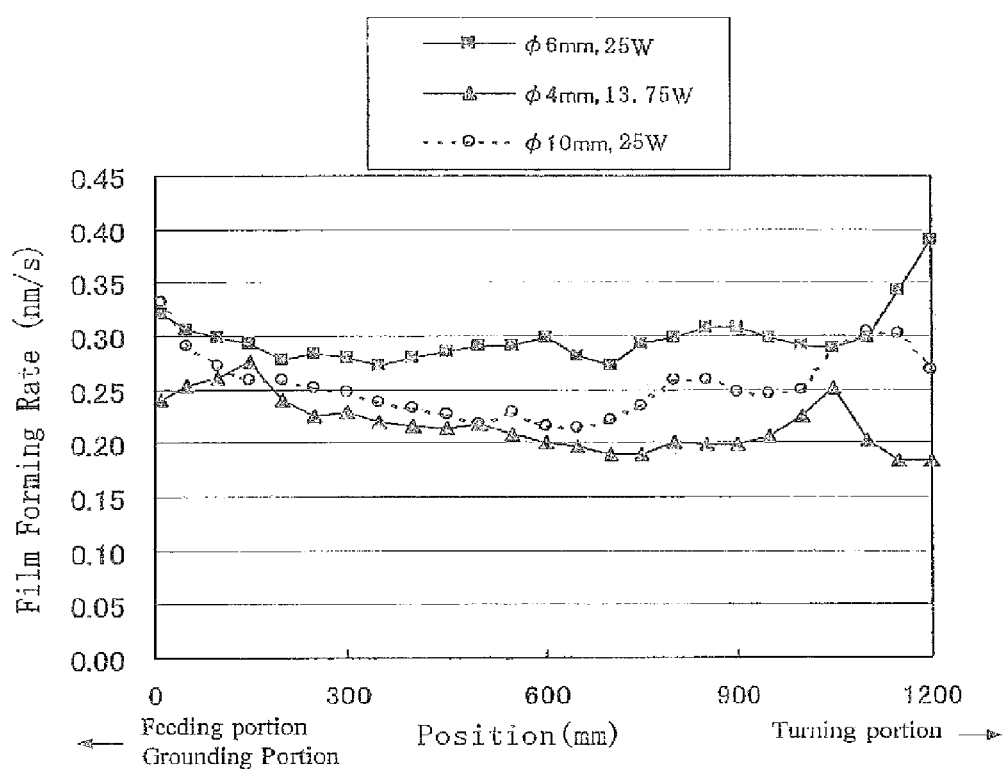

FIG. 7 is a diagram showing the film thickness distribution of the first example.

Figure 8:
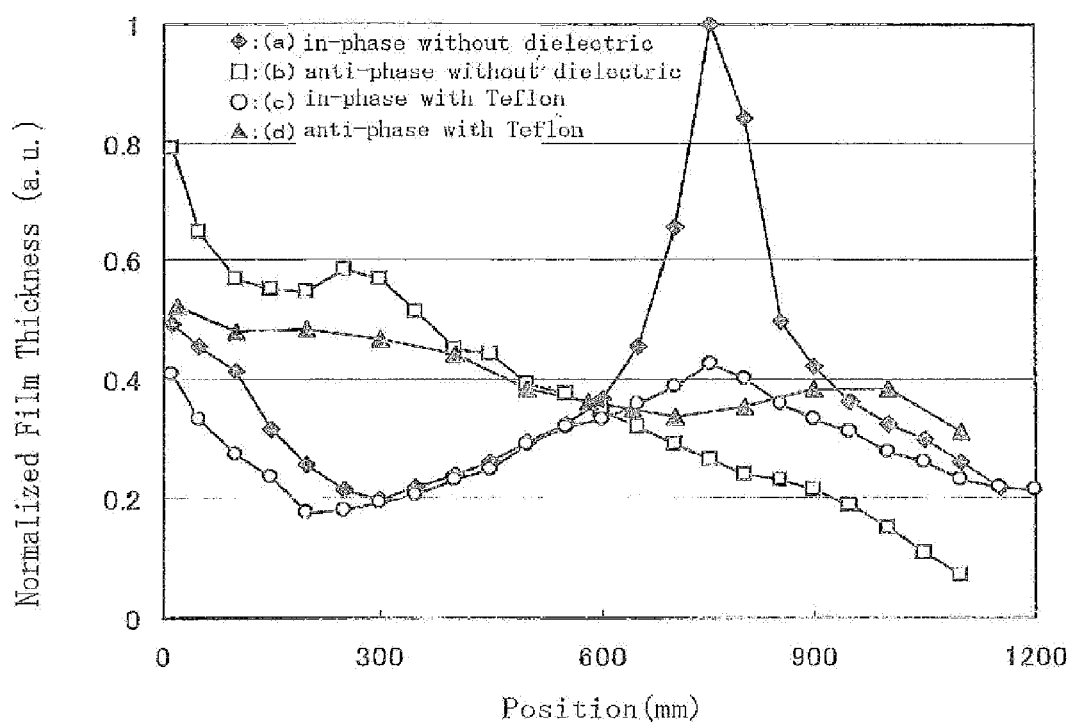

FIG. 8 is a diagram showing the film thickness distribution of the second example.

In these drawings, a numeral 1 denotes a deposition chamber; 2, an inductively coupled electrode; 3, a dielectric; 4, a turning portion; 5, a gas inlet; 6, an exhaust port; 7, a high frequency power source; 8, a coaxial cable; 9, a power feeding portion; 10, a grounded portion; 11, a substrate; and 12, a substrate holder.

PREFERRED EMBODIMENTS OF THE INVENTION

The embodiments of this invention will be explained in detail with reference to the drawings.

First Embodiment

Figure 1:
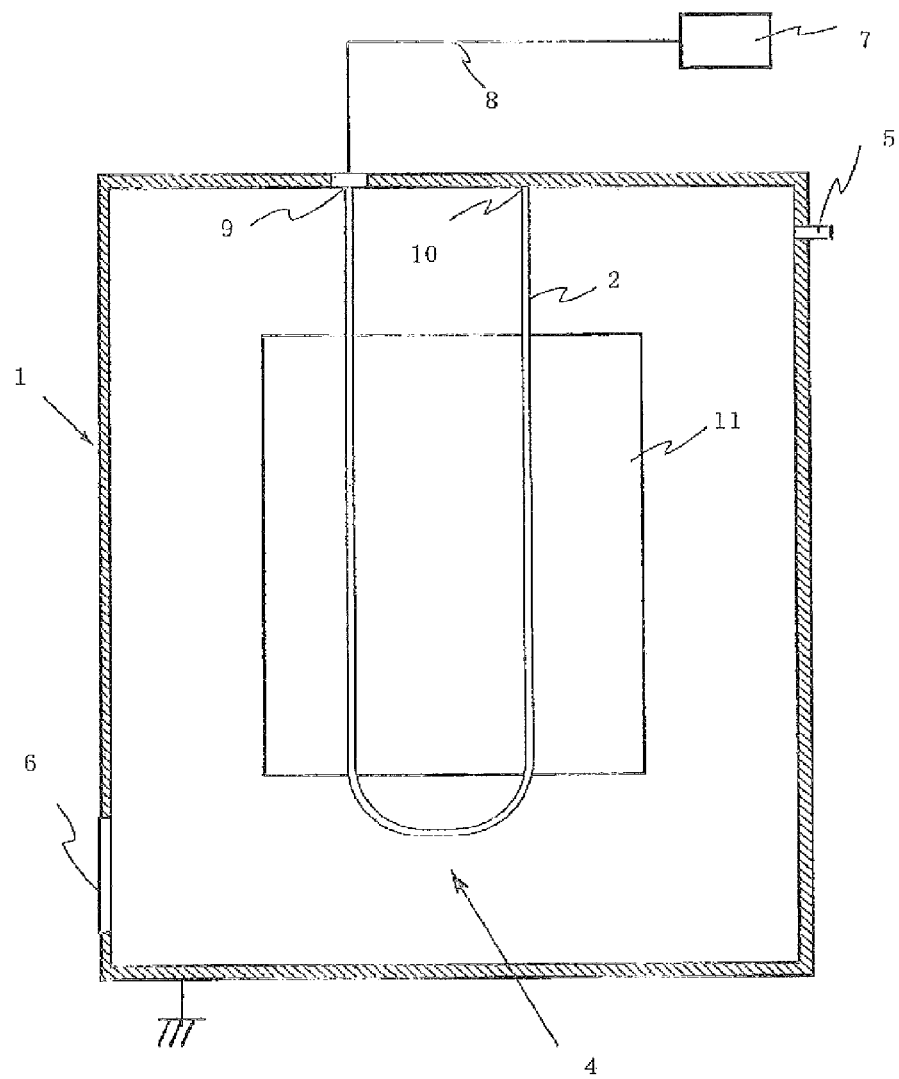
FIG. 1 is a schematic sectional view showing the first embodiment of a plasma CVD apparatus of this invention
Figure 2:
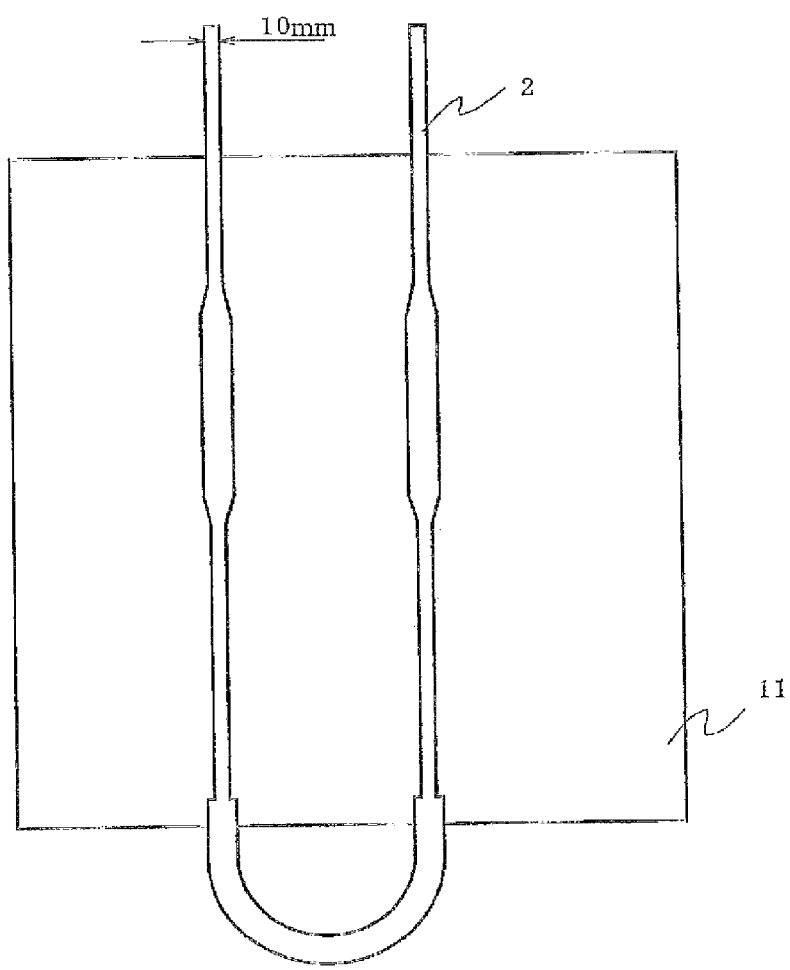
FIG. 2 is an example of the structure of inductively coupled electrode.

FIG. 1 is a schematic sectional view showing the first embodiment of a plasma CVD apparatus of this invention. In the plasma CVD apparatus, as shown in the drawing, a plurality of inductively coupled electrode 2, folded into U-shape with a diameter of 10 mm or less, is placed in a deposition chamber 1 having a gas inlet 5 and an exhaust port 6. One end of electrode, a power feeding portion 9, is connected to a high-frequency power source 7 by a coaxial cable 8, and the other end, the grounded portion 10, The grounded portion 10 is connected to the wall of the deposition.

Here, the distance from the feeding portion 9 and grounded portion 10 to the turning portion 4 is preferably set to be nearly n/2 times (n: a natural number) of the excitation wavelength of the high-frequency power. By such setting, the plasma can be stably generated and maintained. The turning portion is the semicircular portion having a curvature in the case of the U-shape electrode shown in FIG. 1.

The inductively coupled electrode of this embodiment exemplified by FIG. 1 is constructed, for example, by bending a conductive rod or pipe having an outer diameter of 10 mm or less, made of stainless steel, Al, Cu or the like, into the U-shape. The electrode having a turning portion in a rectangular shape is also available. Moreover, the whole of electrode is not necessarily conductive. Therefore, the structure in which an insulator is covered with a conductor, for example, is also available. The electrode of center-folded shape in this invention is not limited to one that is constructed by bending, e.g., single rod or pipe. That is, the electrode having a structure in which two straight line electrodes are jointed and fixed with a metal plate or the like is also employed. The turning portion in the case of the rectangular shape is exemplified by a straight portion between the two straight line electrodes.

In this embodiment, so far as the diameter of the electrode is partially 10 mm or less, between the feeding portion and the turning portion, the diameter of the rest of the electrode can be larger than 10 mm. Therefore, the diameter may be constant over the entire electrode, or may be varied in the longitudinal direction; for example, the diameter can be gradually increased from the feeding portion toward the turning portion. There is no limitation in the lower limit of the electrode diameter. So far as the electrode will not be broken down, enduring supplied power and stable discharge can be maintained, an extremely thin electrode can be employed. However, the electrode having a diameter of 1-10 mm is preferably employed from a viewpoint of handling and easy attachment.

For example, the glow discharge region can be expanded toward the end (or the turning portion) with smaller power by making the feeding side of the electrode thinner than 10 mm. Consequently, a larger film formation region can be prepared, which makes film deposition on a large-sized substrate possible.

Moreover, with the electrode having a smaller diameter on the feeding side, the plasma density near the feeding portion is relatively decreased. That is, since the ratio of plasma density in the vicinity of power feeding portion to the film formation region becomes small, the energy is efficiently used for film formation, and therefore the amount of film deposited on inner wall near the power feeding portion will be decreased. Thus, since the repetition number of film deposition increases until the film deposited on the inner wall becomes so thick as to start peeling off, the maintenance cycle is remarkably extended and overall productivity is improved.

Next, here will be described the method of forming a thin film on a substrate using the plasma CVD apparatus of FIG. 1.

First, reactive gases for deposition are introduced at a predetermined flow rate into deposition chamber 1 through gas inlet 5, and the pressure inside the deposition chamber is set to a predetermined value by adjusting the main valve (not shown) disposed in exhaust port 6. Then, high frequency power is fed to power feeding portions 9 from high frequency power source 7. The frequency of high frequency is adjusted to establish a standing wave, resulting in the generation of the plasma along electrode 2. The plasma is expanded toward the electrode end (or the turning portion) along electrode 2 from the feeding portion and grounded portion. The reactive gases are decomposed and activated by the plasma to form a thin film with an excellent uniformity of film thickness on substrate 11 disposed in the position facing the electrodes 2. Here, the electric discharge is further expanded toward the electrode end with smaller power by using the electrode whose diameter on power feeding side is 10 mm or less. Moreover, when the same power is fed, higher deposition rate is obtained for thinner electrode. Furthermore, since the plasma density near the power feeding portion becomes low, the amount of the film deposited on the inner wall will decrease.

So far electrodes having a diameter of 10 mm or less on the power feeding side have been described. In this embodiment, electrodes having a diameter more than 10 mm can also be employed if the diameter is varied in the longitudinal direction. That is, although the light and dark non-uniformities are partially observed in the plasma distribution when the electrode having a constant diameter and a center-folded shape is employed, the ratio of light and dark part of the plasma can be reduced to improve the uniformity of film thickness by varying the diameter, corresponding to the light and dark plasma position.

Therefore, by adopting electrodes having a varying diameter and a diameter of 10 mm or less at least partially, both effects of glow discharge region expansion and the plasma homogenization will be acquired, Consequently, a uniform thin film can be formed on a larger-sized substrate.

Second Embodiment

Figure 3:
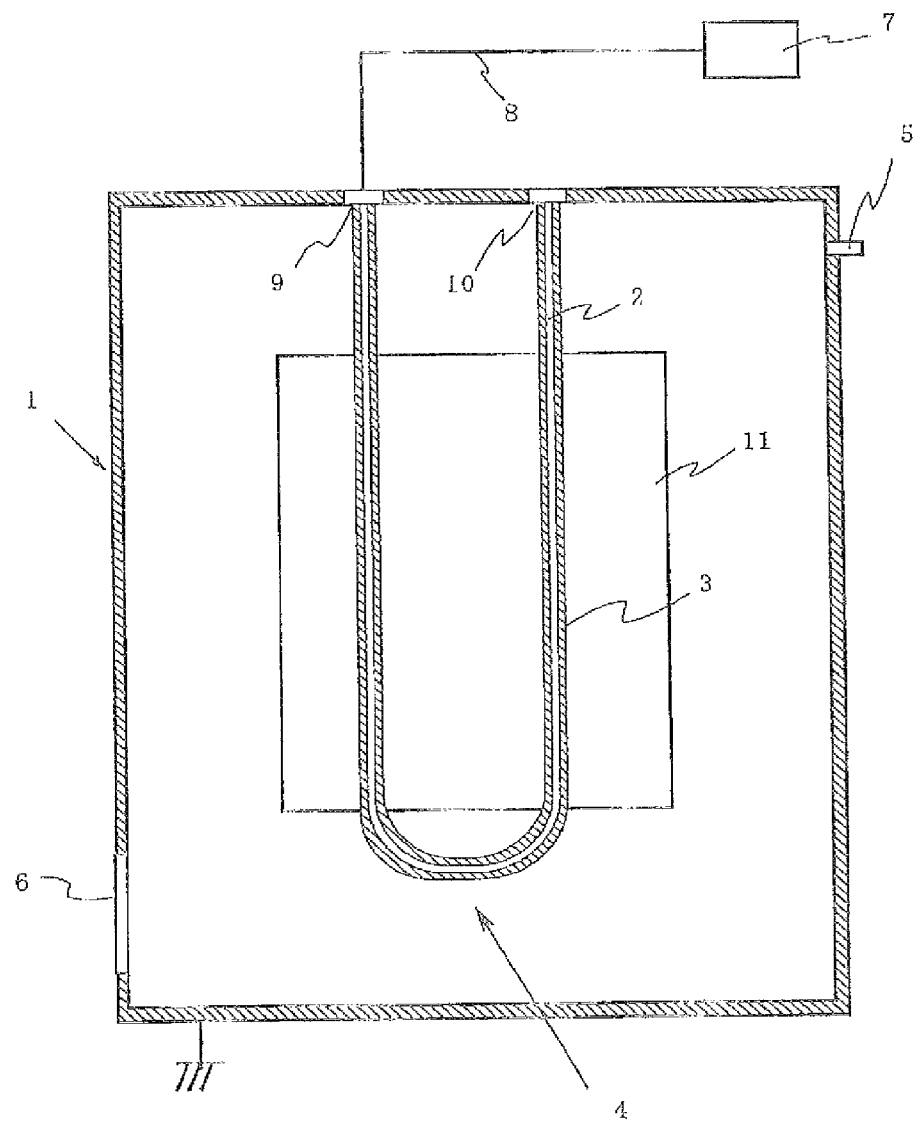
FIG. 3 is a schematic sectional view showing the second embodiment of a plasma CVD apparatus of this invention.

FIG. 3 is a schematic sectional view showing the 2nd embodiment of the plasma CVD apparatus of this invention. The apparatus configuration is the same as that in FIG. 1, except for the inductively coupled electrode 2. In this embodiment, the surface of the electrode is covered with a dielectric 3 such as Teflon.

The dielectric may be formed on entire surface of the electrode as shown in FIG. 3, or partially. In any case, the film thickness uniformity can be improved. The position and shape of the dielectric are determined according to the pattern of plasma density distribution (or film thickness distribution).

If the entire electrode surface, for example, is covered with a dielectric, the peak in the film thickness distribution is reduced in intensity, which is considered to appear as a result of the interactive effect between the attenuation of high frequency power with propagation and the standing wave, and therefore the area having a prescribed uniformity of film thickness is expanded. Furthermore, the film thickness uniformity of the thin film can be further improved by changing the thickness of dielectric in the longitudinal direction of the electrode.

Figure 4:
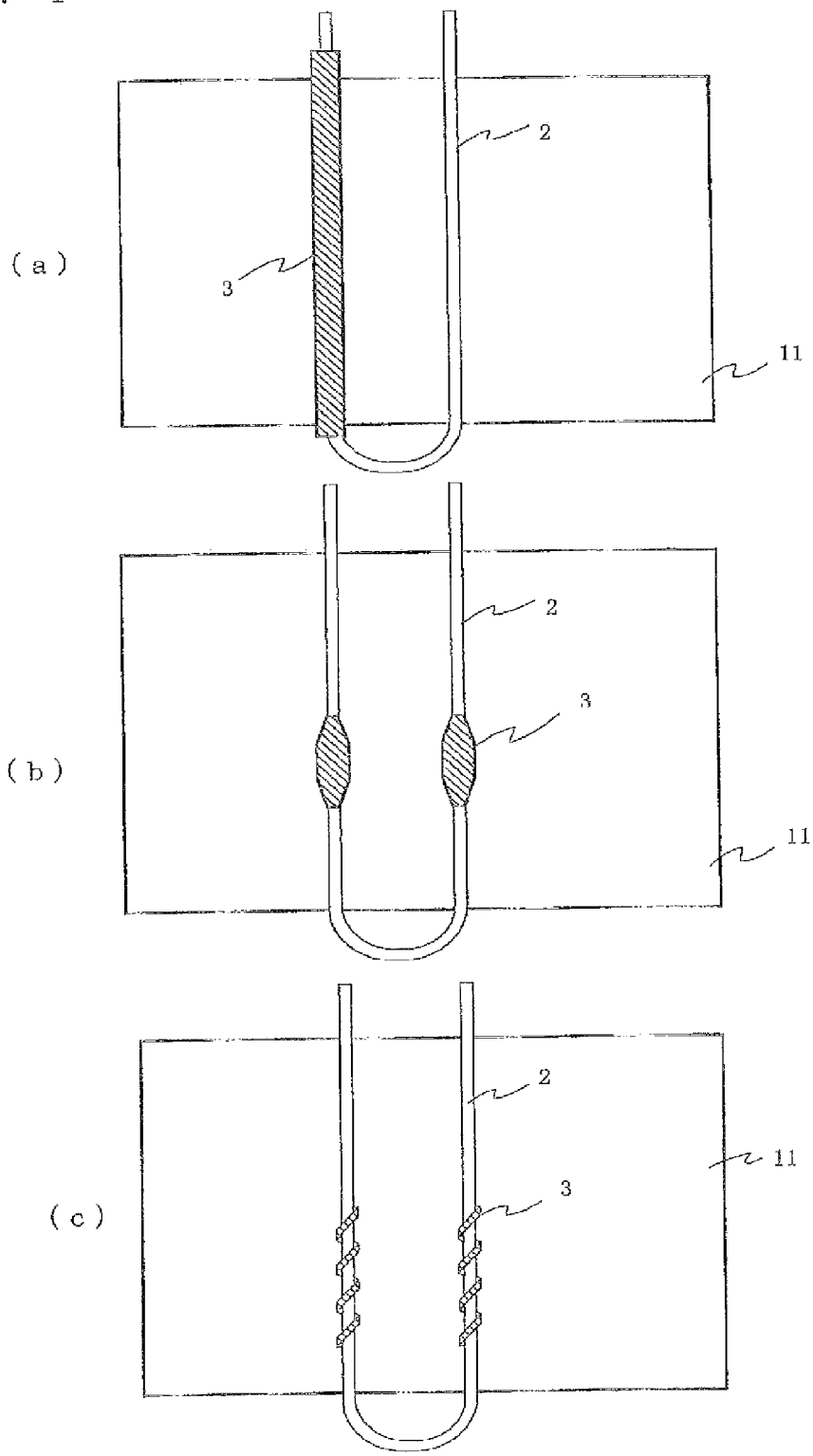

Moreover, the dielectric can be formed only on the power feeding side of the electrode as shown in FIG. 4 (*a*), instead of the entire surface of electrode. In this configuration, the increase of the plasma density is suppressed on the power feeding portion side, which homogenizes the plasma density over the whole electrode to improve the film thickness uniformity.

Furthermore, if the electrode is provided with the dielectric only on the positions corresponding to high plasma density, more uniform film can be deposited in the longitudinal direction of the electrode. When the dielectric becomes too thick, the plasma density may increase at the edge of dielectric, resulting in peak of the film thickness at the corresponding position of substrate. In this case, the dielectric preferably has a tapered edge in the cross-section, as shown in FIG. 4 (*b*). That is, the thickness of dielectric is gradually decreased towards the end of dielectric. The uniformity of film thickness is further improved since the peak is prevented from generating at the position on the substrate corresponding to the edge. The dielectric may be wounded spirally around the longitudinal direction of the electrode as shown in FIG. 4 (*c*), which averages the plasma density in the dielectric edge region and improves similarly the film thickness distribution.

The thickness of dielectric is suitably determined, depending on the dielectric constant of material and the degree of plasma density distribution (film thickness distribution). In the case of, for example, Teflon, the preferable thickness is 0.1 mm or more. As the dielectric, any material that is stable to plasma and heat is employed. That is, organic materials such as Teflon or inorganic materials such as alumina and quartz are employed. However, the material having a large dielectric loss should be avoided.

In this embodiment, a straight line electrode can also be employed in stead of the electrode which is folded back shown in FIG. 1. In this case, the power feeding portion and the grounded portion are fixed to the walls of the deposition chamber, facing to each other. Then, the distance L between two portions and excitation wavelength $\lambda$ are set so that the relation of $L=n\cdot\lambda/2$ should approximately hold. Here, n is a natural number.

As have been mentioned in the first and second embodiments, it is possible to form thin films having an excellent uniformity of thickness on large area substrates by adopting each or combination of the following electrode configurations; 1) the electrode having a diameter of 10 mm or less partially or entirely between the power feeding portion and the grounded portion, 2) the electrode having a varying diameter, and 3) the electrode covered with a dielectric.

Third Embodiment

The 3rd embodiment of the plasma CVD apparatus of this invention is shown in FIG. 5.

Only one inductively coupled electrode is arranged in the deposition chamber of PCVD apparatus shown in FIGS. 1 and 3. In contrast, when the film is deposited on a wide substrate, a plurality of electrodes are arranged in parallel so as to cover the substrate width and a high frequency power is fed to each electrode as shown in FIG. 5. Here, a numeral 12 denotes a substrate holder.

It is desirable to feed high frequency power to the electrodes in such a way that the phase thereof is controlled at respective feeding portions. If the phase of each electrode is not controlled, the film thickness distribution in the substrate widthwise direction is apt not to be uniform or reproducible. Furthermore, it is preferable to make anti-phase (that is, phase difference of 180 degrees) between adjacent electrodes. By reversing the phase of high frequency between adjacent electrodes, the thin film having a uniform thickness and characteristic can be formed over the entire substrate. These are also true for the case where a plurality of straight line electrodes are employed instead of the electrodes having a folded back configuration such as U-shaped.

As a method for alternatively feeding anti-phase high frequency power to a plurality of electrodes, for example, the distance between the feeding portion and the turning portion (the distance between the feeding portion and the grounded portion for the straight line electrode) of alternate electrode may be elongated by a half wavelength of the high-frequency wave, and placing the feeding portions outside of the deposition chamber. Alternatively, coaxial cables equivalent to the half wavelength may be added to the feeding portions of alternate electrodes. Instead, a phase shifter may also be equipped to a high frequency power source to feed the high frequency power shifted by a half-wavelength to the feeding portions of the adjacent electrodes. By supplying the anti-phase high frequency power, the film thickness uniformity is further improved not only in the substrate widthwise direction but also in the longitudinal direction of the electrode.

Fourth Embodiment

The 4th embodiment of the plasma CVD apparatus of this invention is shown in FIG. 6.

A plasma CVD apparatus of this embodiment further is characterized by arranging the electrode array, the plurality of electrodes arranged so as to cover substrate width as shown in FIG. 5, in a plurality of layers with a predetermined interval, and that substrates are arranged on both sides of each layer. With this configuration, the simultaneous film formation on a number of substrates (that is, six substrates in the case of drawing) is made possible, which drastically increases a throughput. Moreover, since the distance between the electrode array and the substrate can be made as small as about 30 to 60 mm, it is possible to realize a thin film deposition apparatus which has a high throughput per floor space of the apparatus.

In this invention, the high frequency power source in a 30-300 MHz of VHF band is preferably employed.

EXAMPLES

Next, examples are given below to explain this invention more concretely.

First Example

Straight rods or pipes having various outer diameters, bent into U-shape or folded into rectangular shape were arranged in the apparatus shown in FIG. 5. Then, plasma was generated under various conditions in order to form thin films and to be observed visually.

In the first example, stainless steel or Cu rods or pipes having an outer diameter of 1, 4, 6 and 10 mm were bent into U shape or folded into rectangular shape so as to have a distance of 30 mm between centers of rods or pipes and a length of 1570 mm. Then, the feeding side surface of each electrode was covered with Teflons tube as shown in FIG. 4 (a). Six electrodes were arranged to have a distance between center of rods or pipes of 30 mm in a common plane as shown in FIG. 5. A substrate 11 of 1200 mm×500 mm was placed 40 mm apart from the electrode surface. The power feeding portions of the electrodes were connected to the connecting points of the feed through inside the deposition chamber and the grounded portions were connected to the inner wall of the chamber.

After introducing SiH4 gas at a flow rate of 200 sccm into the deposition chamber 1 and adjusting the pressure to be 1 Pa, the high frequency power was fed so that the phase was made in anti-phase between adjacent electrodes. The frequency was adjusted to establish a standing wave, and a-Si thin film was deposited on substrate 11. The frequency of the high frequency power employed was 85 MHz which half wavelength (=1765 mm) in the vacuum is not exactly identical with the distance L (=1570 mm) between the power feeding portion 9 and the turning portion 4. This is due to differences of the dielectric constant in plasma and in vacuum. As a matter of fact, the stable discharge was generated at this frequency.

The electrode having an outer diameter of 1 mm was fabricated using a Cu wire and 2 mm thick Teflon. Stainless steel rods were employed and covered with 1 mm thick Teflon for fabricating electrodes having outer diameters of 4, 6, and 10 mm. In addition, the U-shape configuration was adopted for 1 mm and 10 mm electrodes, and the rectangularly folded shape was adopted for 4 mm and 6 mm electrodes. The discharge region was visibly observed for each electrode system with a variety of power supplied, which is shown in Table 1. Moreover, the film thickness distributions were exemplified in FIG. 7, which were measured in the longitudinal direction of the electrode at the central part of substrate.

TABLE 1

| | | \multicolumn{5}{c}{Supplied power per electrode (W)} | | | | |
|---|---|---|---|---|---|---|
| | | 3.13 | 6.25 | 12.5 | 18.75 | 25 |
| Diameter of Electrode (mm) | 1 | ◯ | ◉ | ◉ | ◉ | ◉ |
| | 4 | Δ | ◯ | ◉ | ◉ | ◉ |
| | 6 | — | Δ | ◯ | ◉ | ◉ |
| | 10 | — | — | Δ | ◯ | ◉ |

◉: Electric discharge was expanded to the end of electrode
◯: Electric discharge was expanded to ¾ of the electrode.
Δ: Electric discharge was expanded to ½ of the electrode.
—: Stable discharge was not maintained As is apparent from Table 1, as the electrode becomes thick, the power required to expand the discharge region toward the electrode end becomes higher. That is, there is observed a tendency that the discharge region is not expanded or stable discharge is not maintained when the supplied power is low. On the contrary, when thinner electrode is employed, the stable discharge can be maintained and discharge region can be expanded to increase the film deposition area with low power. FIG. 7 shows the deposition rates when electrodes having a variety of diameters were used. In FIG. 7, power supplied to each electrode was 25 W for the 6 mm and 10 mm electrode, and the power was 13.75 W for the 4 mm electrode. As is apparent from the film thickness distribution of FIG. 7, the uniform film thickness distribution can be obtained over a wide range by using an electrode having a diameter of 10 mm or less and by feeding a predetermined power. Moreover, it has been found that higher deposition rate is obtained with the thinner electrode when the same power is supplied. It is likely from this point that the energy efficiency becomes higher as the electrode becomes thinner.

Although not shown in Table 1, it was also observed that the plasma near the power feeding portion becomes less bright and close to the brightness of the plasma in the film deposition region as the electrode becomes thinner. This is in good agreement with the film thickness distribution in FIG. 7, where the deposition rate is steeply increased toward the power feeding portion (the position outsides the left end of the diagram) when the electrode is thick, while the increasing degree of deposition rate is decreased as the electrode becomes thinner.

Example 2

The film thickness distribution is changed by covering the electrode with dielectric and by the power supply method, which will be described in this example.

The film formation of a-Si was made on glass substrates using the plasma CVD apparatus shown in FIG. 5. A stainless steel pipe having a diameter of 10 mm was bent into U shape to have a distance of 30 mm between centers of the pipes and a length of 1570 mm, and the entire surface was then covered with Teflon tube of 1 mm in thickness. Six electrodes were arranged to have a distance between the center of the pipes of 30 mm in a common plane as shown in FIG. 5. A substrate 11 of 1200 mm×500 mm was placed 40 mm apart from the electrode surface.

After introducing SiH4 gas at a flow rate of 200 sccm into deposition chamber 1 and adjusting the pressure to be 1 Pa, high frequency power of 25 W was fed to each electrode to generate plasma. The frequency was adjusted to establish a standing wave and to form a-Si thin film on substrate 11. Here, the phase was made in-phase or in anti-phase between adjacent electrodes. Other conditions were the same as those of Example 1.

The film thickness distributions were measured in the longitudinal direction of the electrode along the central part of substrate, which are shown in FIG. 8. The film formations using electrodes which were not covered with dielectric were also carried out for comparison. These are also shown in FIG. 8.

The high frequency supply method and the electrode configuration shown in the diagram are as follows; (a) in-phase without dielectric, (b) anti-phase without dielectric, (c) in-phase with Teflon, and (d) anti-phase with Teflon. The horizontal axis denotes the position on the substrate in the longitudinal direction, and the vertical axis denotes the normalized film thickness.

As is apparent from FIG. 8, by using electrodes covered with Teflon, the peak near the substrate position of 800 mm that appeared as the result of the interactive effect of the attenuation and a standing wave of high frequency disappears, remarkably improving the film thickness uniformity. Moreover, by feeding anti-phase high frequency power to adjacent electrodes, the film thickness uniformity is further improved.

Thus, by uniformly covering the entire electrode with a 1 mm thick Teflon, and supplying anti-phase high frequency power, the film thickness distribution is greatly improved as compared with the prior art. Furthermore, it becomes possible to form a more uniform thin film even on a large-sized substrate having a size of 1200 mm or more by varying the thickness of dielectric in the longitudinal direction of the electrode, or by partially covering the electrode with a dielectric.

As mentioned in the examples, it becomes possible to further expand a uniform plasma region by using an electrode having a diameter of 10 mm or less, bent into U-shape or folded into rectangular shape or by using an electrode covered with a dielectric. It also becomes possible to reduce the film deposition on the inner wall of the chamber near power feeding portions, which can extend the maintenance cycle and improve the productivity.

APPLICATION TO INDUSTRY

The electric discharge region can be expanded in the longitudinal direction of electrode to form thin films on a larger substrate by a plasma CVD method of this invention; i.e., by supplying high frequency power on an inductively coupled electrode which has a diameter of 10 mm or less partially or entirely between the power feeding portion and the grounded portion and by generating the plasma so that a standing wave is established. The plasma is maintained with smaller power by employing thinner electrode. When the same power is supplied, higher deposition rate is obtained with thinner electrodes. Furthermore, since the plasma density near the power feeding portion can be reduced by using thinner electrodes, the film deposition is decreased on the apparatus inner wall near power feeding portions, which greatly decreases cleaning frequency.

Furthermore, by varying the diameter of the electrode or by covering the electrode with a dielectric, the plasma density distribution can be partially adjusted in the longitudinal direction of the electrode, which makes it possible to form thin films with an excellent uniformity of film thickness.

It becomes also possible to further improve the film thickness uniformity by arranging a plurality of inductively coupled electrodes, and alternately supplying anti-phase high frequency power.

Thus, it is possible to realize a plasma CVD apparatus which requires low cleaning frequency, and can form thin films having an excellent thickness uniformity on a large area substrate.

The arrangement of inductively coupled electrodes of this invention in a plurality of layers, with substrates on both sides of each layer can provide a plasma CVD apparatus and method of a high throughput.

What is claimed is:

1. A plasma CVD method comprising:
   arranging, in a reaction chamber, an electrode array, the electrode array including a plurality of inductively coupled electrodes arranged in a plurality of electrode layers, each electrode being folded back at a center so that each electrode is substantially U-shaped with two parallel straight portions and having a feeding portion at a first end and a grounded portion at a second end and a folded back portion at the center, the electrodes being arranged such that all of the parallel straight portions are arranged parallel to each other in a common plane, and an entire surface of each of the electrodes being covered with Teflon or alumina,
   feeding high frequency power to establish a standing wave of a half wavelength or a natural number multiple of a half wavelength between said feeding portions and said folded back portions and between said grounded portions and said folded back portions to generate a plasma of reactive gas introduced in said reaction chamber to form a thin film including at least one element constituting the reactive gas, and
   setting a phase difference between adjacent two feeding portions of said electrodes to 180 degrees, and
   wherein a plurality of said electrode layers are arranged such that substrates are arranged on both sides of each electrode layer, and
   the plurality of said electrode layers are arranged at one interior side of the chamber so that a predetermined gap is formed between the plurality of said electrode layers and another interior side of the chamber opposite to the one interior side.

2. The plasma CVD method of claim 1, wherein the standing wave is established by adjusting a frequency of the high frequency power.

3. The plasma CVD method of claim 1, wherein each of said electrodes having at least a portion with a diameter of 10 mm or less.

4. The plasma CVD method according to claim 1, wherein a frequency of said high frequency power is 60 MHz or higher.

* * * * *